United States Patent [19]

Ross et al.

[11] Patent Number: 4,616,211

[45] Date of Patent: Oct. 7, 1986

[54] DETECTING CODEWORDS

[75] Inventors: Peter F. Ross; Ian W. Rodgers; Rupert L. A. Goodings, all of Cambridge, England

[73] Assignee: Crosfield Electronics Limited, London, England

[21] Appl. No.: 680,017

[22] Filed: Dec. 10, 1984

[30] Foreign Application Priority Data

Dec. 8, 1983 [GB] United Kingdom ................ 8332773

[51] Int. Cl.[4] .............................................. H03M 7/42
[52] U.S. Cl. ............................. 340/347 DD; 375/106
[58] Field of Search ............... 340/347 DD; 358/260, 358/261; 375/106, 110, 111, 112

[56] References Cited

U.S. PATENT DOCUMENTS 3,016,527 1/1962 Gilbert ........................ 340/347 DD
4,177,456 12/1979 Fukinuki ..................... 340/347 DD

*Primary Examiner*—Charles D. Miller
*Attorney, Agent, or Firm*—Sughrue, Mion, Zinn, Macpeak and Seas

[57] ABSTRACT

A method and apparatus for detecting digital codewords or predetermined portions of digital codewords in a stream of codewords is described. The apparatus comprises a shift register (21) having a length at least one bit greater than the length of the longest codeword or predetermined codeword portion to be detected; and means including an inverter (24) for loading the shift register (21) with the logical complement of the leading bit of the stream of codewords. A clock (25) is provided to cause data in the data stream to be serially shifted into the shift register (21). The contents of the shift register after each shift are then used to address one or more PROMs (26) to determine whether the data in the shift register (21) upstream of the first change between data in the shift register of one type and data in the shift register of the complementary type comprises a codeword or a predetermined codeword portion.

10 Claims, 1 Drawing Figure

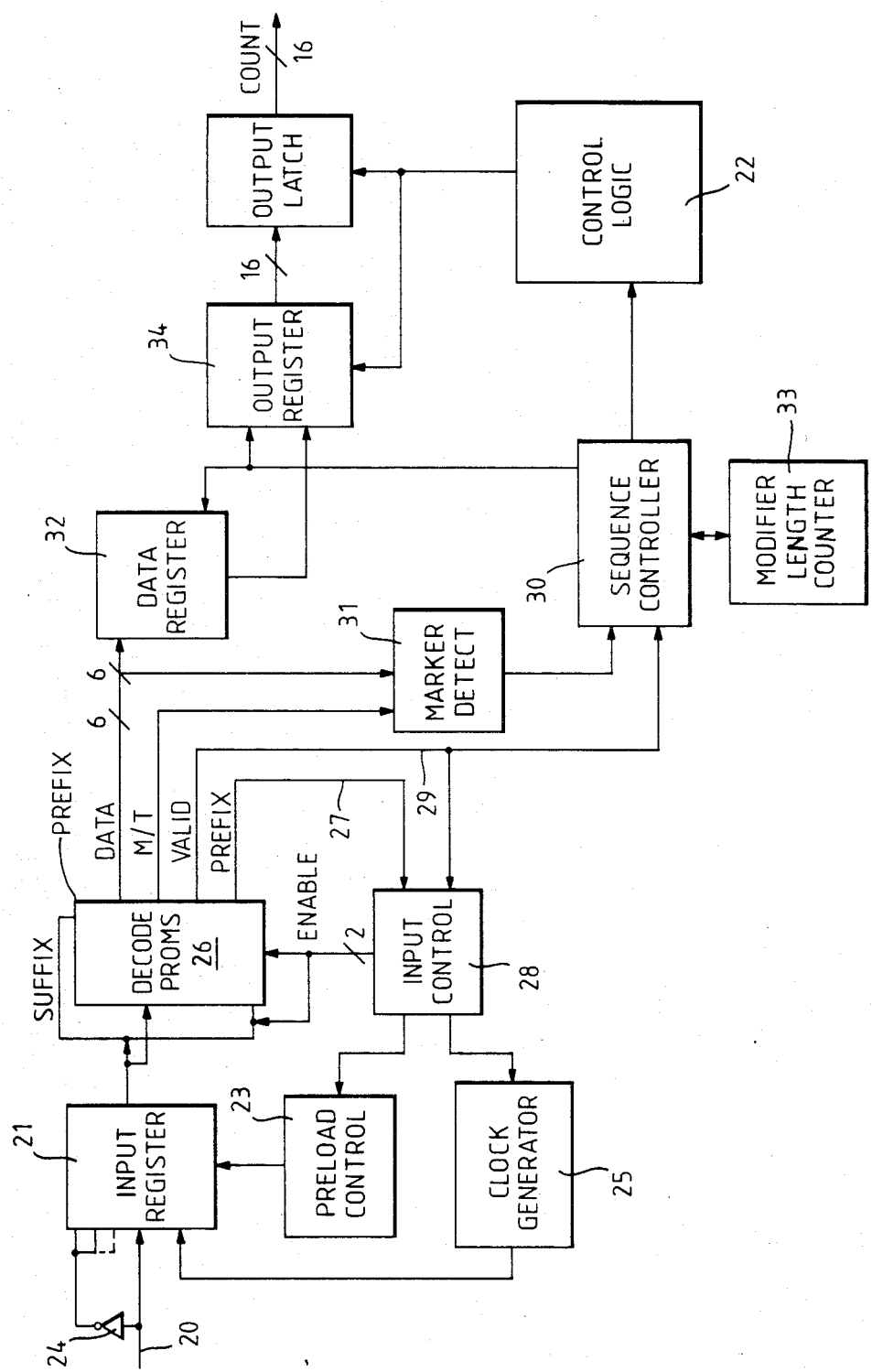

DETECTING CODEWORDS

BACKGROUND OF THE INVENTION

The invention relates to a method and apparatus for detecting digital codewords of a codeword system.

An example of a codeword system is a system of digital codewords of varying length in which no short codeword forms the prefix of a longer codeword in the same system.

In the field of picture (including text) storage and transmission, it is conventional practice to scan the picture line by line to determine run lengths of pixels of different colours in each line and then to code this information in order to minimise storage space or transmission time. One example of such a codeword system is the modified "Huffman" (MH) codeword system as described in Recommendation T.4—"Standardisation of Group III Facsimile Apparatus for Document Transmission" published by the CCITT.

The codewords are commonly of differing lengths and this can lead to difficulties in detecting individual codewords in an incoming data stream for subsequent decoding unless markers are provided between successive codewords.

Various methods have been proposed in the past to deal with this, one of which comprises applying the serial data stream of codewords to a shift register. Subsequently, the loaded data is applied to a ROM which is effectively a look-up table and which determines whether there is a codeword present in the loaded data. If there is, the ROM will output the decoded data and will also output a number corresponding to the number of bits in the detected codeword so that the shaft register will then shift in a corresponding count of new data bits. The process is then repeated. This procedure requires a large ROM in view of the necessity of counting the number of bits in the codeword and providing a suitable output which may comprise three or more binary digits.

SUMMARY OF THE INVENTION

In accordance with one aspect of the present invention, a method for detecting digital codewords or predetermined portions of digital codewords in a stream of codewords of a codeword system of digital codewords of varying length in which no short codeword forms the prefix of a longer codeword in the same system comprises (1) loading a shift register, having a length at least one bit greater than the longest codeword or predetermined codeword portion to be detected, with the logical complement of the leading bit of the stream of codewords;

(2) serially shifting the data in the stream into the shift register; and (3) determining whether the data in the shift register upstream of the first change between data in the shift register of one type and data in the shift register of the complementary type comprises a codeword or a predetermined codeword portion.

This invention provides a significant improvement over the prior art since it is no longer necessary to count the number of bits shifted into the shift register or the number of bits forming a detected codeword.

Preferably, step 3 is performed after each shift of data into the shift register.

Preferably, if a codeword is detected, the shifting of data into the shift register is temporarily terminated to allow the detected codeword to be decoded, steps 1 to 3 then being repeated to enable the next codeword in the stream to be detected.

Conveniently, step 3 comprises addressing a memory with the contents of the shift register, the memory having been preloaded at each valid address with data corresponding to each codeword or predetermined portion of a codeword.

In some code systems, for example the Huffman system mentioned above, a number of the longer codewords have the same prefix. Conveniently, the predetermined codeword portion comprises this common prefix.

When a prefix of a codeword is detected, the method may further comprise repeating steps 1 to 3 to detect a suffix of the codeword.

In accordance with a second aspect of the present invention, apparatus for detecting digital codewords or predetermined portions of digital codewords in a stream of codewords of a codeword system of digital codewords of varying length in which no short codeword forms the prefix of a longer codeword in the same system comprises a shift register having a length at least one bit greater than the length of the longest codeword or predetermined codeword portion to be detected; means for loading the shift register with the logical complement of the leading bit of the stream of codewords; control means for causing data in the data stream to be serially shifted into the shift register; and detecting means for determining whether the data in the shift register upstream of the first change between data in the shift register of one type and data in the first register of the complementary type comprises a codeword or a predetermined codeword portion.

Preferably, the means for loading the shift register with the logical complement of the leading bit of the stream of codewords comprises an inverter.

The detecting means may comprise one or more PROMs which are addressed by the contents of the shift register.

This invention is particularly applicable for use with the inventions described and claimed in our copending U.S. application Ser. Nos. 680,028 and 680,018 of even date respectively entitled "Data Coding" and "Codeword Decoding".

BRIEF DESCRIPTION OF THE DRAWING

An example of a method and apparatus in accordance with the invention will now be described with reference to the accompanying drawing, in which:

FIG. 1 is a block circuit diagram.

DETAILED DESCRIPTION OF THE PREFERRED EMBODIMENT

The drawing illustrates a circuit for decoding codewords of the Huffman type, and particularly codewords forming the code system shown in the Table below.

TABLE

| CODEWORD TYPE | RUN | PREFIX | SUFFIX |
|---|---|---|---|
| T | 0 | 00001 | |
| T | 1 | 01 | |
| T | 2 | 001 | |
| T | 3 | 100 | |
| T | 4 | 110 | |
| T | 5 | 0001 | |
| T | 6 | 1110 | |
| T | 7 | 1111 | |

TABLE-continued

| CODEWORD TYPE | RUN | PREFIX | SUFFIX |
| --- | --- | --- | --- |
| M | 0 | 0000000 | 0001 |
| M | 1 | 101 | |
| M | 2 | 000001 | |
| M | 3 | 0000001 | |
| M | 4 | 0000000 | 1 |
| M | 5 | 0000000 | 01 |
| M | 6 | 0000000 | 0000 |
| M | 7 | 0000000 | 001 |

M and T indicate that the codeword is a make-up codeword or a terminator codeword respectively.

The codewords themselves are in binary form for ease of electrical representation and it will be seen that all the terminator codewords comprise a prefix only while some of the make-up codewords include additionally a suffix.

It should be noted that the prefix of any codeword in the code system is not the same as a complete shorter codeword enabling the codewords to be uniquely identified in a continuous bit stream.

This code system is based on a multiplicative modifier of eight. The invention is equally applicable for use with code systems based on additive modifiers such as the MH systems.

As will be apparent from the Table, the codewords have a variable length and are supplied in serial form along a line 20 to an eight bit input shift register 21. The codewords may have been received from a remote device of conventional form for generating MH codes or from the encoding device shown in FIG. 1 of our copending U.S. Application of even date entitled "Data Coding" and the decoding circuit shown may be part of a Crosfield DATRAX 760 system in which case the codes represent scan run lengths of, for example text. Overall operation of the decoder is under the control of control logic 22 although connections between the control logic 22 and a majority of the other circuit elements have been omitted for clarity.

One of the problems with decoding variable length codewords is in determining the beginning of a codeword which is wholly or partly contained in the input register 21. This problem is solved by setting a preload control latch 23 just before a new codeword is to be loaded into the input register 21. The setting of the preload control latch 23 enables the parallel input of the input register 21. The incoming data representing the codeword is also applied to the input register 21 in parallel via an inverter 24. Since the parallel input of the input register 21 is enabled the register 21 will be preloaded with the logical complement of the leading bit of the incoming codeword. Immediately thereafter i.e. after one clock cycle the preload control latch 23 is reset which in turn enables the shift input of the input register 21 and the incoming codeword is shifted in series into the input register 21 under the control of a clock generator 25.

The preloading of the input register 21 has the effect of locating the start of an incoming codeword since this will occur at the first transition between data of one type in the input register 21 and data of the complemental type.

In theory, the amount of PROM address space needed to decode Huffman codewords of up to 16 bits is about 64K. This is unworkable in practice and the circuit illustrated in the drawing provides a solution to this problem. The solution uses the fact that all codewords in the code system shown in the Table which have a length greater than 7 bits have an identical (predetermined) prefix which, in this case, is "0000000". In fact, the code system has been designed to have this property.

It should be noted that the longest codeword or portion (prefix) of a codeword which is decoded in one step is 7 bits and so the input register has a size of eight bits. This is one more than the maximum size required, to enable the detection of the start of a codeword or codeword portion (as previously described).

After each shift of data into the input register 21, the data in the register 21 is used to address a set of prefix and suffix decode PROMs 26.

In practice, the decode PROMs 26 will be programmed so that each accessible address will correspond to the contents of the input register 21 corresponding to the presence of a full valid codeword in the input register or a prefix as described below.

Initially the prefix PROMs are enabled by an input control latch 28 and addressed. If the contents of the input register 21 is recognised by the decode PROMs 26 as a prefix, the decode PROMs 26 issue an appropriate signal (PREFIX) on a line 27 to the input control latch 28. This is set accordingly which in turn sets the preload control latch 23 which enables the parallel input of the input register 21 as previously explained. The remaining portion of the incoming codeword is then shifted into the input register 21 after initial preloading with the logical complement of the leading bit and again, after each shift as controlled by the clock generator 25, the contents of the input register 21 are applied to the decode PROMs 26. In this case, however, the suffix PROMs are enabled by the setting of the input control latch 28 while the prefix PROMs are disabled. If the full suffix has not yet been shifted into the input register 21 the suffix PROMs will not detect a valid suffix and shifting will continue. Once a valid suffix is detected a corresponding output signal (VALID) will be supplied along a line 29 to the input control latch 28 which is reset and to a sequence controller 30. The resetting of the input control latch 28 stops further shifting of data into the input register 21 and enables the prefix PROMs.

The detection of a valid suffix is also accompanied by the output of a signal (M/T) indicating whether the full codeword is a make-up codeword or a terminator codeword and this is fed to a marker detect latch 31. The data corresponding to the valid codeword detected is passed in parallel from the suffix PROMs to a data register 32 and to the marker detect latch 31.

If a prefix is not detected but instead a shorter codeword is being decoded then this will be decoded immediately by the prefix PROM which will remain enabled under the control of the input control latch 28 and as with the suffix case, data corresponding to the incoming codeword will be passed to the data register 32 and to the marker detect latch 31 while a "VALID" signal will be fed to the sequence controller 30 and to the input control 28 which will temporarily prevent any further codewords from being decoded.

Each portion of data supplied to the data register 32 will have a fixed length corresponding to the modifier length. In this case, with a modifier of 8, the modifier length will be 3. The modifier length is set in a modifier length counter 33 which is decremented by the sequence controller 30 as data in the data register 32 is serially shifted into an output register 34. While this shift is taking place the control logic 22 permits the input control latch 28 to allow the next portion of a codeword or the beginning of the next codeword to be loaded into the input register 21. After each portion of the incoming codeword has been decoded, the decoded data is shifted serially into the output register 34 until a full 16 bits are present in the output register 34. These are then shifted in parallel under the control of the control logic 22 to an output latch 35 from where the data can be fed as desired to storage or to further processing means.

The marker detect latch 31 senses for the presence of a make-up zero run length and in particular when this occurs as a first word of a run. This cannot happen in practice and is used during the encoding process to indicate the end of a block of run lengths. When such an end of block marker is detected the sequence controller 30 is disabled by the marker detect latch 31.

We claim:

1. A method for detecing digital codewords or predetermined portions of digital codewords in a stream of codewords of a codeword system of digital codewords of varying length in which no short codeword forms the prefix of a longer codeword in the same system, comprising the steps of:
   (a) inverting a leading bit of said stream of codewords to provide a logical complement of said leading bit,
   (b) loading a shift register, having a length at least one bit greater than the longest said codeword or said predetermined codeword portion to be detected, with the logical complement of the leading bit of said stream of codewords;
   (c) serially shifting said data in said stream into said shift register; and
   (d) determining whether said data in said shift register upstream of the first change between data in said shift register of one type and data in said shift register of said complementary type comprises one of a codeword and a predetermined codeword portion.

2. A method according to claim 1, wherein the logical complement of the leading bit of said stream of codewords is loaded into the shift register in parallel.

3. A method according to claim 1, wherein said (d) is performed after each of said shifts of data into said shift register.

4. A method according to claim 1, wherein if a codeword is detected, said shifting of data into the shift register is temporarily terminated to allow said detected codeword to be decoded, said steps (a) to (d) then being repeated to enable the next codeword in said stream to be detected.

5. A method according to claim 1, wherein said (d) comprises addressing a memory with the contents of said shift register, said memory having been preloaded at each valid address with data corresponding to each said codeword or said predetermined portion of a codeword.

6. A method according to claim 1, wherein at least some of said digital codewords to be detected have a common prefix, said predetermined codeword portion comprising said common prefix.

7. A method according to claim 6, wherein when a prefix of a codeword is detected, said method further comprises repeating said steps (a) to (d) to detect a suffix of said codeword.

8. Apparatus for detecting digital codewords or predetermined portions of digital codewords in a stream of codewords of a codeword system of digital codewords of varying length in which no short codeword forms the prefix of a longer codeword in the same system, said apparatus comprising a shift register having a length at least one bit greater than the length of the longest said codeword or said predetermined codeword portion to be detected; an inverter for loading said shift register with the logical complement of the leading bit of said stream of codewords; control means for causing data in said data stream to be serially shifted into said shift register; and detecting means for determining whether said data in said shift register upstream of the first change between data in said shift register of one type and data in said shift register of said complementary type comprises one of a codeword and a predetermined codeword portion.

9. Apparatus according to claim 8, further comprising means coupled between the inverter and the shift register for loading the shift register in parallel.

10. Apparatus according to claim 8 wherein said detecting means comprises at least one PROM which is addressed by the contents of said shift register.